United States Patent
Ono et al.

[11] Patent Number: 5,110,407
[45] Date of Patent: May 5, 1992

[54] SURFACE FABRICATING DEVICE

[75] Inventors: Tetsuo Ono; Susumu Hiraoka, both of Kokubunji; Keizo Suzuki, Kodaira, all of Japan

[73] Assignee: Hitachi, Ltd., Tokyo, Japan

[21] Appl. No.: 658,399

[22] Filed: Feb. 20, 1991

[30] Foreign Application Priority Data

Mar. 7, 1990 [JP] Japan .................................. 2-53646

[51] Int. Cl.⁵ ...................... H01L 21/306; B44C 1/22; C23F 1/02
[52] U.S. Cl. .................................... 156/643; 118/730; 118/50.1; 118/620; 156/646; 156/656; 156/657; 156/659.1; 156/662; 156/345; 204/192.37; 204/298.36; 427/38
[58] Field of Search ............... 156/628, 643, 646, 651, 156/656, 657, 659.1, 662, 345; 204/192.32, 192.34, 192.35, 192.37, 192.1, 192.11, 298.01, 298.04, 298.31, 298.36; 427/38; 118/728, 729, 730, 620

[56] References Cited

U.S. PATENT DOCUMENTS

| | | | |
|---|---|---|---|
| 4,734,152 | 3/1988 | Geis et al. | 156/646 |
| 4,874,459 | 10/1989 | Coldren et al. | 156/643 |
| 4,874,460 | 10/1989 | Nakagawa et al. | 156/345 X |

*Primary Examiner*—William A. Powell
*Attorney, Agent, or Firm*—Fay, Sharpe, Beall, Fagan, Minnich & McKee

[57] ABSTRACT

Anisotropic etching can be obtained in the direction of the incident heated beam of reactive gas with the introduction of a second material for controlling reactivity.

51 Claims, 4 Drawing Sheets

SURFACE FABRICATING DEVICE

BACKGROUND OF THE INVENTION

The present invention relates to surface fabricating of a semiconductor and a metal.

An example of surface fabricating is etching of semiconductors. It is known to etch semiconductors with plasma and to control the surface reaction of the plasma with the semiconductor by introducing and mixing oxygen or nitrogen into the plasma of a reactive gas. Such a technique is discussed, for example, in J. Vac. Sci. Technol. B1 23 (1983). The method described therein mixes $O_2$ or $N_2$ into the plasma of $SF_6$ or the like and conducts etching. SiO or Si—N is formed during the reaction and prevents etching of the sidewall of the etching hole. This plasma etching involves high energy ions, of some dozens of eV to several hundreds or even a thousand eV, which are implanted into the surface of the substrate during etching by use of plasma. Charge damage or mechanical damage to the substrate surface raises problems as is known. In plasma etching, a material is turned into a plasma consisting of ions and charged particles. Adjacent the substrate, a high voltage will accelerate the plasma into the substrate. Mechanical damage can occur, for example, the silicon to silicon bonding can be broken, causing damage in the crystalline structure of a silicon substrate. Also, charge damage can occur, for example, the charged particles can cause charge particles in the interface between silicon oxide and silicon in a MOS device, to seriously affect its performance in a disadvantageous way.

Japanese Patent Laid-Open No. 113775/1986 does not use plasma and therefore does not damage the N-type substrate surface, but instead uses a heated beam of reactive gas for etching the substrate. The heated gas beam may be a neutral particle beam so that there is no charge damage and since the energy of this beam is below 1 eV, it hardly mechanically damages the substrate. This method can anisotropically etch undoped silicon (Si) by the use of $Cl_2$ as a reactive gas. A heated beam of reactive gas, as used in this disclosure, refers to a gas that is chemically reactive to the substrate or in some other way causes an etching in the substrate, which is thermally excited to increase its reaction rate so that it can etch, and which is not a plasma, meaning that it does not contain ions and electrons and is therefor neutral. The term neutral is not referring to chemical neutrality, but rather to charge neutrality.

Japanese Laid-Open No. 62-86732 laid open Apr. 21, 1987 from Application No. 60-226718 filed Oct. 14, 1985, discloses a deposition process, specifically a process for depositing silicon oxide as an insulator on a substrate, with or without a mask. The silicon is projected onto the substrate along with the projection of heated oxygen, which reacts on the surface of the substrate and deposits silicon oxide. The heating of the oxygen is sufficient so that it becomes thermally reactive. In the disclosure, it is felt that some unreacted silicon is also deposited, which will detract from the insulator properties of the film being deposited. Therefore, FIG. 2 of the disclosure uses $SF_6$ in a heated state, so that unreacted silicon will be removed from the deposited film as it is formed, which in a sense is etching. However, the overall process is one of deposition and not one of etching. The added material $SF_6$ enhances etching, or more accurately, causes a form of etching.

In Japanese Laid-Open 62-86730 laid open Apr. 21, 1987 from Application No. 60-226722 filed Oct. 14, 1985, it is desired to etch a silicon substrate. $SF_6$ is projected onto the substrate, but it will not react to effectively produce etching by itself. Addition energy must be provided. Therefor, $CO_2$, in a thermally excited or heated state, is introduced only for the purpose of providing thermal energy causing the $SF_6$ to etch the substrate, otherwise the $CO_2$ is not active and it is not reactive. The added material $CO_2$ causes the etching to happen, that is increases the etching rate.

The etching rate of $Cl_2$, in a thermally excited, that is, heated state, can be increased by the addition of ions, electrons or photons, which is electrically assisted etching. The additional material increased the etch rate of the silicon substrate.

Of further interest is Application No. 62-237501 filed Oct. 25, 1985, Laid-Open No. 62-98731, laid open May 8, 1987.

SUMMARY

It is an object of the present invention to determine, analyze and solve problems encountered with the prior art.

Japanese patent Laid-Open No. 113775/1986 does not consider any definite measures when the material to be surface fabricated changes. For example, the document only uses a Si substrate. It has been found experimentally by the present inventors, that when donor-injected silicon (e.g. n-type Si) is etched by a heated $Cl_2$ beam, the sidewall below the mask is also etched and anisotropic etching cannot be obtained.

In surface fabricating using a heated reactive gas, it is an object of the present invention to conduct highly accurate fabrication even when a material to be surface-fabricated changes.

In general, it is an object of the present invention to conduct surface fabricating with less damage and with a higher level of accuracy than any one of the known surface fabricating techniques.

In order to improve surface fabrication accuracy of a metal, particularly a semiconductor or the like, the present invention conducts surface fabrication by use of a heated reactive gas beam and controls the surface reaction by introducing a second material in addition to the reactive gas.

In order to accomplish these objects, the present invention introduces a second material while surface fabricating with a heated reactive gas beam to control the reaction rate on the surface and to improve fabrication accuracy.

In surface fabricating using a heated reactive gas beam, the present inventors have found through experimentation that fabrication accuracy can be improved if surface fabricating is effected while controlling the surface reaction by introducing a second material onto the surface of the substrate during the surface fabricating.

Though the function of the second material is not yet clarified completely, it is assumed as follows. For example, in the case of etching wherein a mask is placed on the semiconductor surface and etching proceeds with respect to the exposed, i.e. unmasked, surface portions, the heated reactive gas beam reacts with the semiconductor exposed surface portions and generates volatile material so that the exposed surface is etched or cut away by evaporation of this volatile material. At this time, the reactive gas that has impinged on the surface and remained unreactive loses its thermal energy and is deflected. Substrate materials that are not evaporated are also being removed. In the known technique, the sidewall of the etched semiconductor below the mask is also etched when the substrate is n-type silicon, that is etching proceeds laterally of the beam to extend beneath the mask. This is believed to be the result of an action of the reflected beam and the above-mentioned removed unevaporated materials. The inventors have found that if nitrogen is introduced as a second material during the above processing, reactivity is lowered by nitrating the exposed surface of the semiconductor substrate so that only the bottom surface continues to be etched while the sidewall is not etched, because the incident heated beam of reactive gas has the highest reactivity where it strikes directly and has lower reactivity after reflection. In other words, anisotropic etching can be obtained in the direction of the incident heated beam of reactive gas with the introduction of a second material for controlling reactivity, according to the present invention.

As described with respect to the conventional techniques, it is known to mix oxygen or nitrogen into plasma in the case of plasma etching. However, there has been no discussion or recognition that mixed oxygen or nitrogen can be employed for etching with a heated reactive gas beam, that is a neutral beam. The heated reactive gas beam has an entirely different etching mechanism than the plasma etching so that the results of using a second material such as oxygen or nitrogen with heated reactive gas beam etching cannot at all be expected or anticipated from known results of using oxygen or nitrogen with plasma etching. The broadly stated result of protecting the sidewall with a second material is the same for the known plasma etching using a second material and the present invention using heated reactive gas beam etching with a second material, but the sameness of the result could not have been anticipated and the function or mechanism providing such a result is entirely different.

The present invention can obtain the same result with respect to semiconductors and metals other than silicon, for example gallium arsenide and doped silicon. When gallium arsenide is etched with a hot reactive gas, undercutting sometimes occurs, for example when the reactive gas is at a particularly high temperature or other means are used to increase the etching rate. The present invention has been used to decrease the etching rate on the side walls and therefore provide sidewall protection and prevent undercutting under such circumstances. Normally, hot reactive gas etching does not undercut pure silicon, but when silicon is doped, e.g. n-type silicon, undercutting will occur. The present invention has been used to reduce, particularly prevent undercutting of doped, particularly n-type silicon substrate with hot reactive gas etching. Doped silicon has a much faster etch rate than pure silicon. On some occasions, it may be desirable to provide some undercutting for different manufacturing purposes. The present invention can be used to reduce the undercutting, but not prevent the undercutting, so that the undercutting can be controlled to the desired extent.

BRIEF DESCRIPTION OF THE DRAWINGS

Further objects, features and advantages of the present invention will become more clear from the following detailed description of a preferred embodiment, with respect to the accompanying drawing, wherein.

DETAILED DESCRIPTION OF THE DRAWINGS

Throughout this disclosure: plasma will refer to primarily ions and charged particles produced from a material; and the term hot reactive gas will refer to a gas that is reactive, particularly in the sense of etching a substrate, which is hot in the sense of being thermally excited to make it an etching gas or to increase its reactivity, which is not a plasma even though there may be a minor amount of charged particles, and which has substantially no charged particles and ions.

Figure 1:
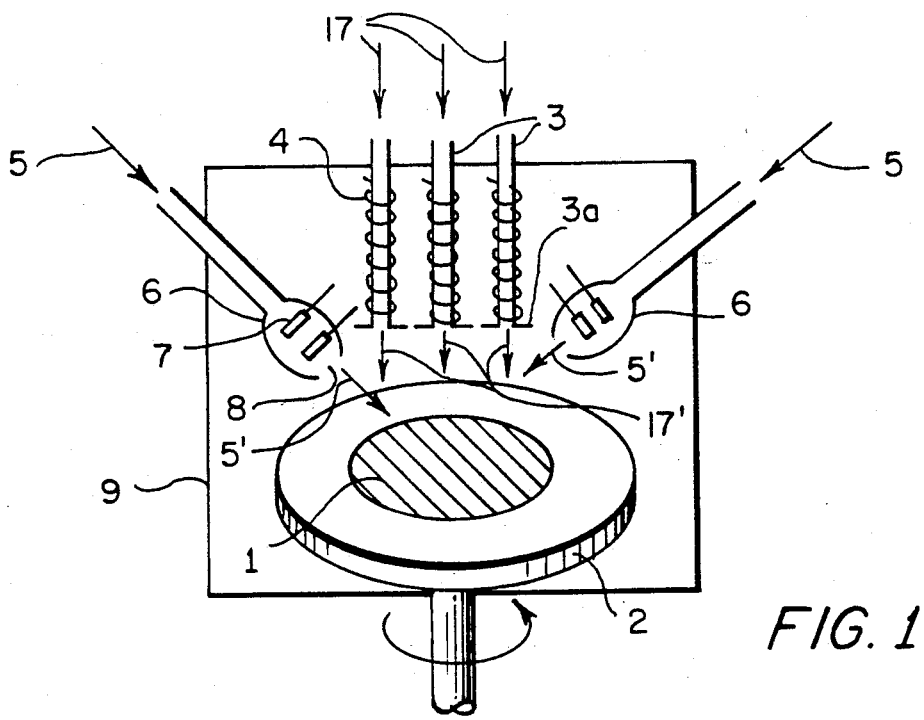
FIG. 1 shows the basic surface fabricating device according to one embodiment of the present invention.
Figure 2A:
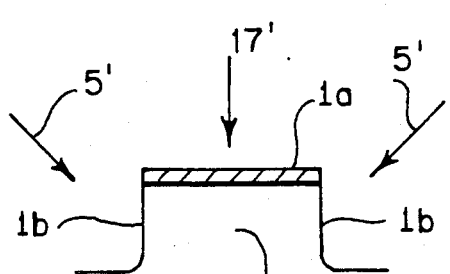
FIG. 2(a) is a cross sectional view of a surface portion of a fabricated substrate produced by the present invention.

FIG. 1 shows the basic construction of a surface fabricating device in accordance with the present invention. A substrate 1 to be etched is placed on a rotatable holding table 2. An etching mask, shown as 1a in FIG. 2(a) is on the surface of the substrate 1. A reactive gas 17 is introduced from the outside of a vacuum chamber 9. The interior of the vacuum chamber 9 is evacuated by vacuum pump, not shown, which is conventional. The reactive gas 17 is expanded into the vacuum chamber 9 through a nozzle 3. An electric heater 4 is wound around the nozzle 3 and heats the reactive gas introduced through the nozzle 3. As shown, a plurality of nozzles 3 and heaters 4 are provided to produce a corresponding plurality of heated reactive gas beams 17', each of which flows in a direction substantially perpendicular to the surface of the substrate 2 that is to be etched.

As is known with respect to heated reactive gas beam etching in general, the translational energy and vibrational energy of the reactive gas molecules are excited by this heating, so that reactivity between the reactive gas beam 17' and the surface of the substrate 1 exposed through holes in the mask 1a becomes extremely high and the etching rate of the exposed substrate surface thereby increases with the heating of the reactive gas. To prevent any contaminates produced by the heater 4 from traveling directly toward the surface of the substrate 1, a plate 3a is fitted around the exit end of each of the nozzles 3. The reactive gas 17 is produced from a first material.

A second material 5 is introduced into the vacuum chamber 9 through a discharge tube 6. The second material is preferably oxygen or nitrogen, for example, and is introduced into the discharge tube 6 from outside of the vacuum chamber 9. Plasma of the second material, oxygen or nitrogen, is generated inside the discharge tube 6 by applying voltage between a pair of electrodes 7, which electrodes are within the discharge tube 6, to generate a plasma discharge that expands through a pin hole 8 at the exit end of the discharge tube 6. As shown, there are a plurality of discharged tubes 6, each with electrodes 7 and pin hole 8. For example, the pin hole has a diameter of 0.1 mm to 2 mm and is sufficient to produce a beam of plasma 5' that is directed onto the surface of the substrate 1. In accordance with the present invention, the expanded plasma beam 5' is applied from an oblique direction to the surface of the substrate 1, that is the plasma beam 5' of the second material is at a substantial acute angle with respect to the hot reactive gas beam of the first material with the acute angle being great enough that the plasma beam 5' will directly strike the side surface 1b of the hole being etched in the surface of the substrate 1 through the mask 1a. A sufficient number of plasma beams 5' are provided to directly strike the side surfaces 1b desired to be protected and at a sufficient angle to pass through the mask and directly strike substantially the entire side surface 1b to be protected. The angle of incidence to the normal of the surface of the substrate 1 is preferably at least 45 degrees, that is, the above-mentioned acute angle between the plasma beam 5' and the hot reactive gas beam 17' is preferably at least 45 degrees.

The exposed surface of the substrate 1 is either oxidized or nitrided, depending upon whether oxygen or nitrogen is the second material, because radicals and ions of oxygen or nitrogen in the beam of plasma 5' are applied to the surface. In this case, the kinetic energy of the radicals and ions applied in the plasma beam 5' is less than or equal to 1 eV and the quantity of second material provided is extremely small in comparison to the quantity of etching plasma that is applied in the conventional plasma etching technique with respect to the same amount of total etching. That is, according to hot reactive gas etching of the present invention, the substrate surface is exposed directly to plasma to an extremely small extent in comparison to conventional plasma etching. Accordingly, the substrate 1 is hardly damaged in accordance with the hot reactive gas etching of the present invention in comparison to the plasma etching of the prior art.

Figure 2B:
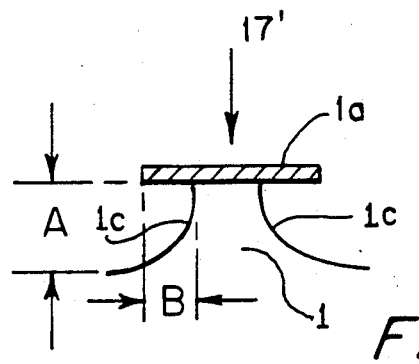
FIG. 2(b) is a cross sectional view of a surface portion of a substrate fabricated in a manner identical to the fabrication used to obtain the substrate of FIG. 2, except that a second material was not added for control of the etching, but the starting substrates were identical.

To uniformly etch the substrate 1, it is advisable to dispose a plurality of nozzles 4 and discharge tubes 6, and it is advisable to rotate the substrate 1 by rotating the holding table 2, as indicated by the arrow in FIG. 1. According to the reactive gas etching provided by the device of FIG. 1, as exhibited by the results of FIG. 2(a), the substrate 1 is etched anisotropically with extremely reduced damage as compared to the prior art etching. The non-anisotropic results of the prior art are shown in FIG. 2(b).

In conventional plasma etching, the energy applied to the plasma may be in the form of 100–1,000 eV through a charge closely adjacent the substrate, which charge is used to accelerate the plasma. As mentioned previously, this high energy can cause mechanical damage, for example, a breaking of the silicon-to-silicon bonding to damage the crystalline structure of the substrate or can cause charge damage, for example the creation of charges between a silicon oxide film and a silicon substrate in a MOS device that will greatly detract from its performance.

However, the plasma used in the present invention only for the purpose of sidewall protection is free plasma, that is it is directed toward a substrate in a free state without being accelerated by a high voltage charge adjacent the substrate, and therefor has an energy of only about 1 eV or less so that the plasma used by the present invention will not cause the mechanical and charge damage, mentioned above with respect to the conventional plasma etching. That is, the technique known as SHEATH for accelerating the plasma with a high voltage in prior art etching is not used in the present invention and therefore the disadvantages associated with such high energy plasma are not to be found in the present invention.

EXAMPLE

The following specific example of etching was conducted with the device of FIG. 1. An n+-type polysilicon layer was provided as the surface of silicon substrate 1 and phosphorous (P) was doped into this surface with a dose of $2 \times 10^{20}$ cm$^{-3}$. The substrate was etched using chlorine, $Cl_2$, as the reactive gas 17. The nozzle 3 was composed of a quartz or graphite pipe and its inner diameter was 2 mm. The heater 4 heated the inside of the nozzle 3 to about 950 degrees C and the temperature of the substrate 1 was about 180 degrees C. The flow of $Cl_2$ as the reactive gas was about 5 sccm (5 cm$^3$ per minute at 0 degrees C and 1 atmosphere), and the flow rate of nitrogen $N_2$ as the second material was 3 sccm. To regulate the etching rate, the supply of chlorine was periodically interrupted; specifically, chlorine was supplied for 5 minutes and stopped for 2 minutes, and this supplying and stopping was repeated. During this time of supplying and stopping the flow of the hot reactive gas, the supply of nitrogen was continued without interruption, so that the hot reactive gas beam 17' was intermittent and the second material plasma beam 5' was continuous. Discharge by the electrodes 7 in the discharge tube 6 was generated at a high frequency of 40 KHz. The distance between the nozzle 4 and the substrate 1 was 5 cm. Under the conditions described, anisotropic etching was accomplished with an etching rate of 5 nm/min to produce the results as shown in FIG. 2(a). In FIG. 2(a) it is seen that the etching in substrate 1 produces side walls 1b that are generally perpendicular to the surface of the substrate 1, parallel to the etching beam and coextensive with the holes in the etching mask 1a, that is, anisotropic.

As mentioned herein, the etching may be controlled by adjusting one or more variables, such as heat, flow of a hot reactive gas, flow of a second material, electrode voltage for forming the plasma of the second material and the like, but the inventors have found the simplest and a very effective technique is to stop and start the flow of reactive gas, preferably, or stop and start the flow of second material, or stop and start the flow of each to differing amounts.

Repeating the above example with the use of oxygen, $O_2$, as the second material instead of nitrogen, in producing the plasma beam 5', obtained a result that is also illustrated with FIG. 2(a), that is the results were the same for oxygen and nitrogen.

The above example repeated without using nitrogen or oxygen, that is without a plasma beam 5' of the second material, produces the result as shown in FIG. 2(b), wherein etching produces side walls 1c that cut into the substrate below the mask 1a. From the above, it is seen that providing second material as a plasma beam controls the etching of the sidewall.

To obtain the anisotropic etching as shown in FIG. 2(a), the etching rate by the reactive gas beam and the oxidation or nitration rate obtained by the oxygen or nitrogen plasma beam 5' must be controlled. This control can be accomplished by regulating the temperature and the flow of chlorine as a reactive gas, the flow of oxygen or nitrogen as the second material and the distance between the exit of each beam and the substrate surface. The method of intermittently supplying the hot reactive gas beam employed in this embodiment can make such control easy.

While electrodes 7 have been employed in FIG. 1, electrodeless discharge by the use of microwave energy, for example, may be better as the discharge method, because such a microwave plasma generating method for the second material is free from the contamination produced by the electrode material. While the present invention is directed to anisotropic etching, etching in other directions can be controlled by changing the quantity of the second material 5 and the angle of the plasma beam.

Figure 3:
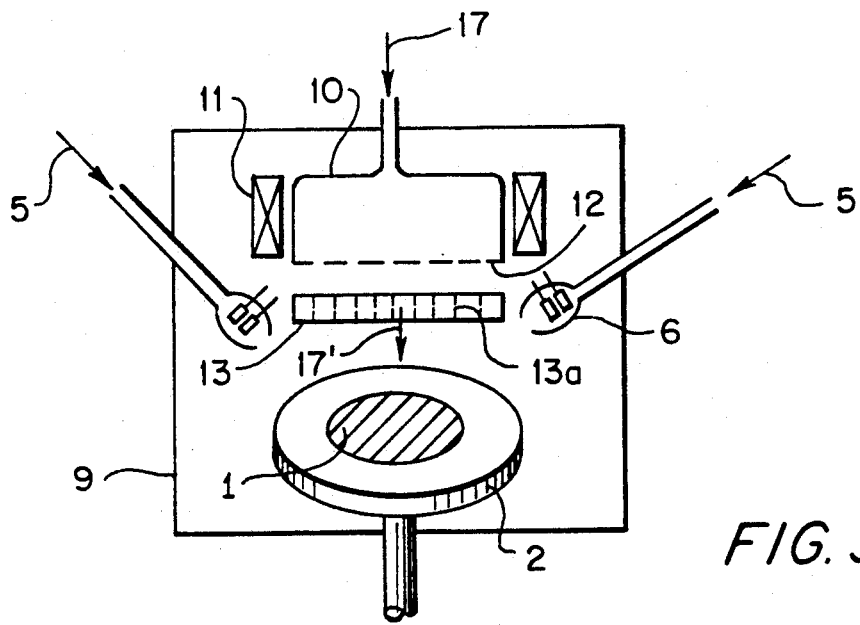
FIGS. 3-10 respectively show modifications of the device of FIG. 1.

FIG. 3 shows a modification of the embodiment of FIG. 1 and differs therefrom with respect to the supplying of the reactive gas and its heating. In FIG. 3, the reactive gas 17 is contained within a gas reservoir 10 and heated by a heater 11. The heated reactive gas is then emitted from a plate 12 having a grid of expansion holes so that the emitted heated reactive gas passes into the vacuum chamber 9 and thereafter its direction is controlled by the collimator 13, so that a plurality of hot reactive gas beams 17′ will directly and perpendicularly impinge upon the surface of the substrate 1 to be etched. The collimator 13 is formed by aligning blade like sheets 13(a) in a grid form in a specific direction with a fixed gap between them. The collimator 13 itself may be heated or not heated depending upon conditions.

Figure 4:
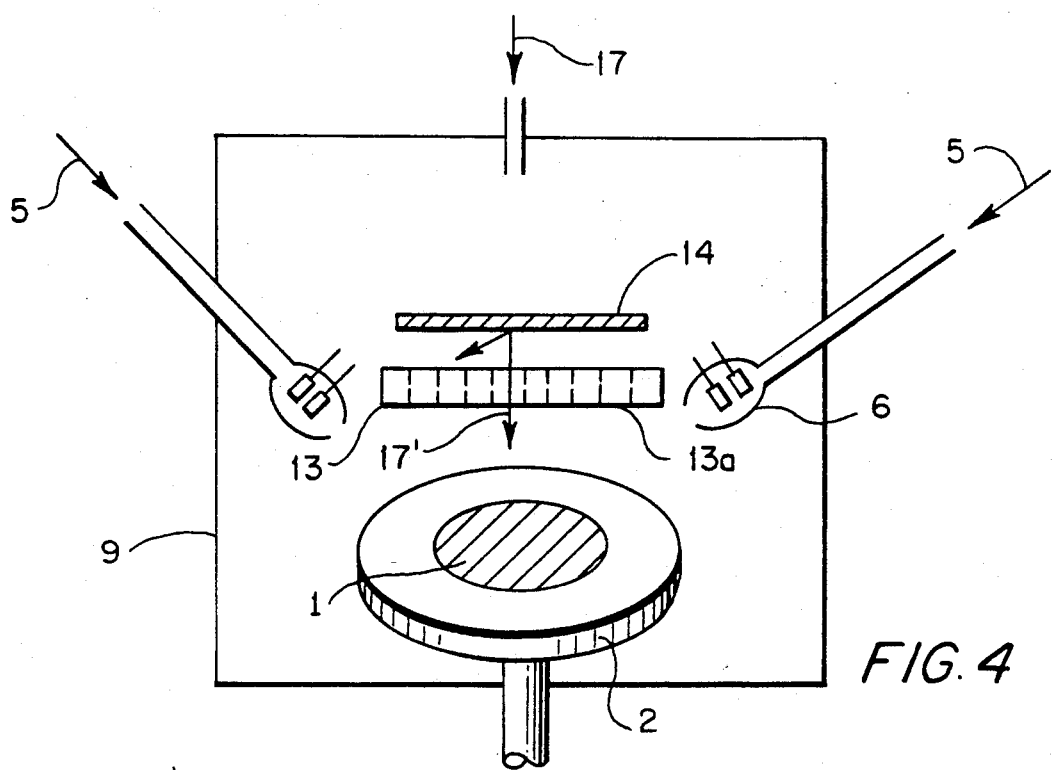

FIG. 4 shows another modification of the device of FIG. 1, differing in the supply and heating of the reactive gas 17. In accordance with FIG. 4, the reactive gas 17 is introduced into the vacuum chamber 9, impinges against a hot plate 14 to be thermally excited, and thereafter its direction is aligned by the collimator 13 to produce the plurality of hot reactive gas beams 17′. The hot plate 14 has a structure wherein a heater is incorporated in a quartz or ceramic plate or is disposed near a quartz plate or a ceramic sheet for heating, for example.

Figure 5:
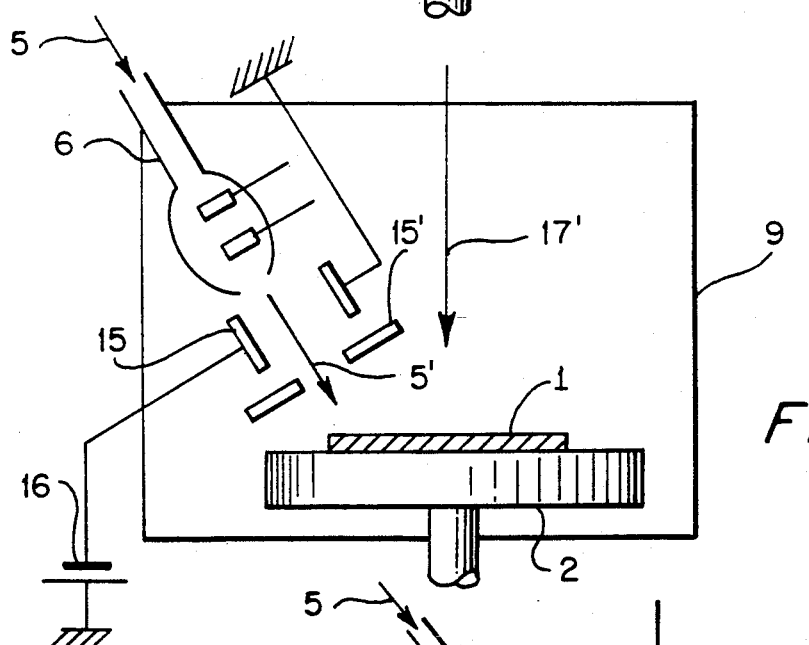
Figure 6:
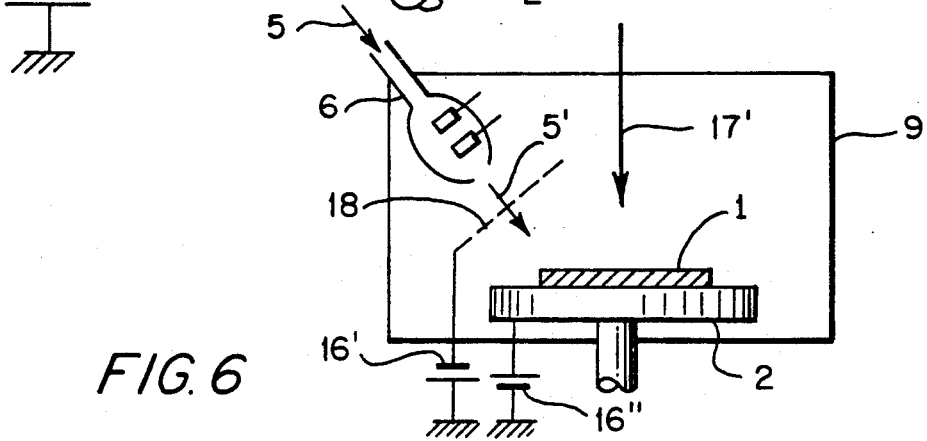

FIGS. 5 and 6 show modifications of the device of FIG. 1 with respect to removing charged particles from inside the plasma beam 5′. For example, the plasma of $N_2$ includes N radicals, N ions and electrons, and the above-mentioned removal of charged particles still leaves a plasma of N radicals, which are not neutral in the sense of the neutral reactive gas. As described already, the influences of the charged particles are not very great in the method of the present invention, but if a strong plasma is generated then the charged particles in the plasma beam 5′ might exert adverse influences. Accordingly, the charged particles can be removed by applying a voltage from a power source 16 to a deflecting electrode 15, as shown in FIG. 5. A shield plate 15′ will collect the deflected charged particles, so that they will not directly strike the substrate. The same result can be obtained by applying a voltage to a mesh 18 or to the substrate or holding table 2 by the use of a power source 16′, 16″ to inhibit incidence of the charged particles onto the surface of the substrate 1 as shown in FIG. 6. Alternatively, the charged particles can be deflected and removed with the use of a magnetic field.

Figure 7:
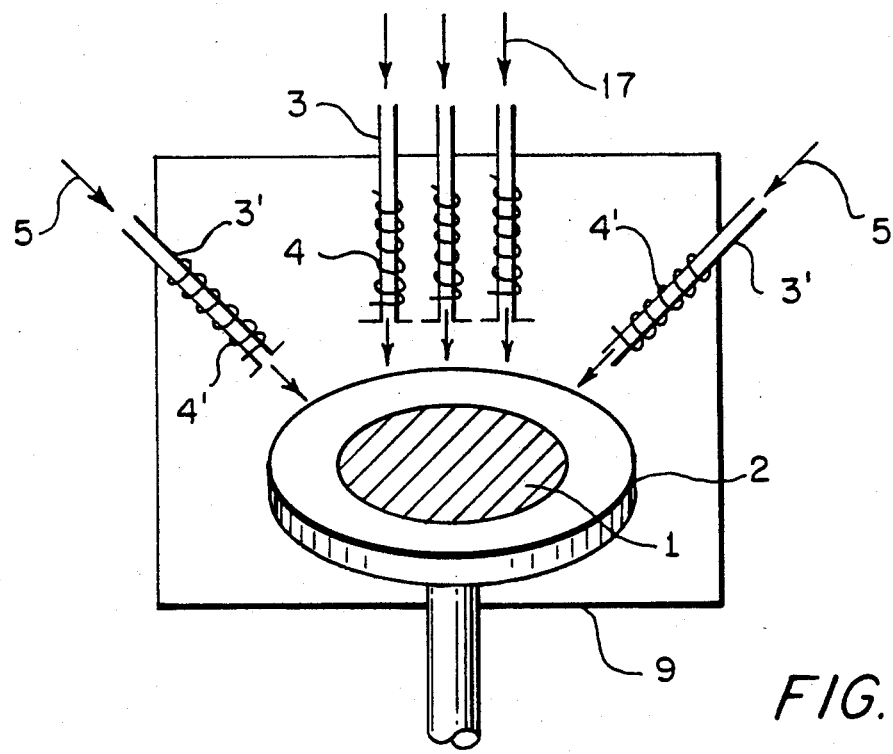

FIG. 7 shows a further modification of the device shown in FIG. 1, with the difference being in the supplying of the second material. In FIG. 7, oxygen or nitrogen as a second material 5 is applied to the substrate 1 through the nozzle 3′ after it is heated by the heater 4′ in the same way as the reactive gas. Since the speed of oxidation and nitration drops according to this modification, a higher effect can be obtained by the use of a gas such as ozone, $O_3$, or ammonia, $NH_3$, as the second material. Since the second material for oxidation or nitration need not be in a beam, it is possible to employ the modification of FIG. 7 wherein ozone or ammonia (a compound of nitrogen) is impinged against a heated sheet without the use of a nozzle and decomposed to generate radicals of oxygen or nitrogen, and these radicals are then supplied to the surface of the substrate 1. If the temperature of the substrate 1 is high, ozone or ammonia need not be heated but may be directly supplied to the substrate surface without heating.

Figure 8:
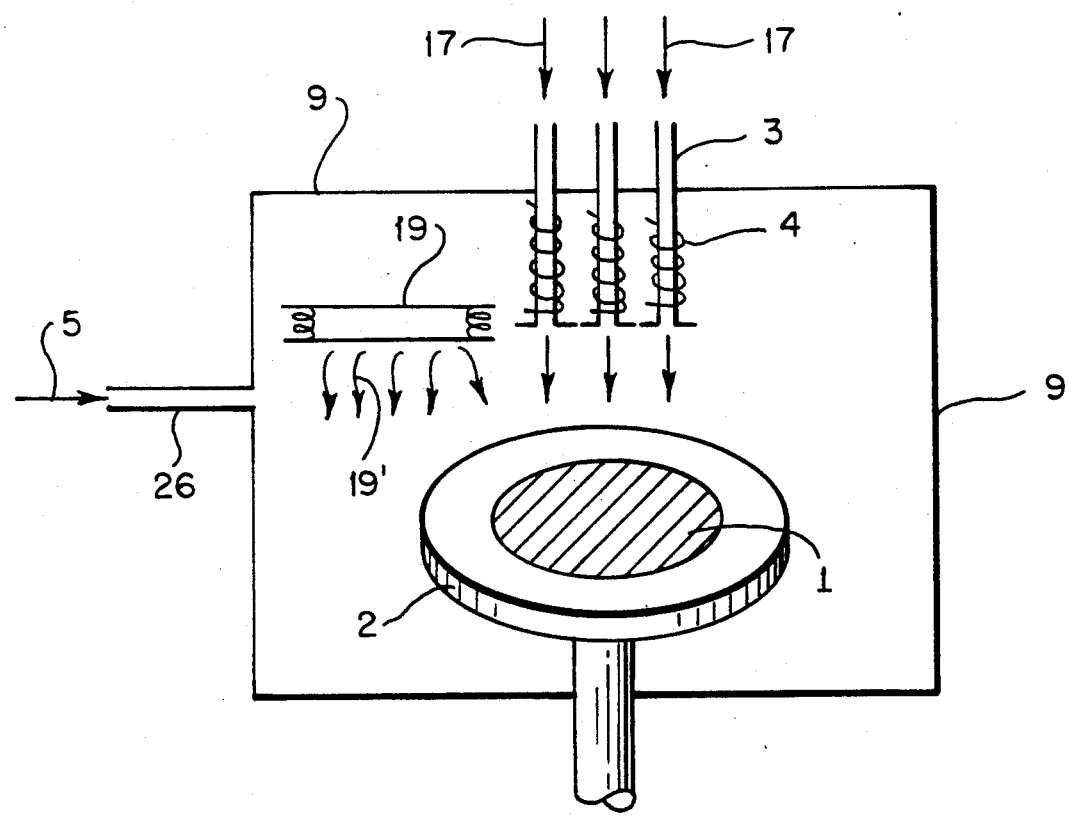

FIG. 8 shows a further modification of the embodiment of FIG. 1, with the difference being in the supplying of second material for the oxidation and nitration. An ultraviolet lamp 19 is disposed inside the vacuum chamber 9 or outside of a window (not shown), of quartz or the like, in a wall of the vacuum chamber 9. The ultraviolet radiation 19′ from the lamp 19 decomposes ozone or ammonia gas 5 introduced from the inlet 26 as the second material to form the radicals of oxygen or nitrogen, respectively. It is also possible to decompose oxygen or nitrogen by the use of a laser (not shown) instead of the ultraviolet lamp 19. In addition, it is further possible to introduce oxygen or nitrogen containing gas into the vacuum chamber so that a chemical reaction provides oxide or nitride deposited on the substrate 1 to protect the sidewall 1b.

Figure 9:
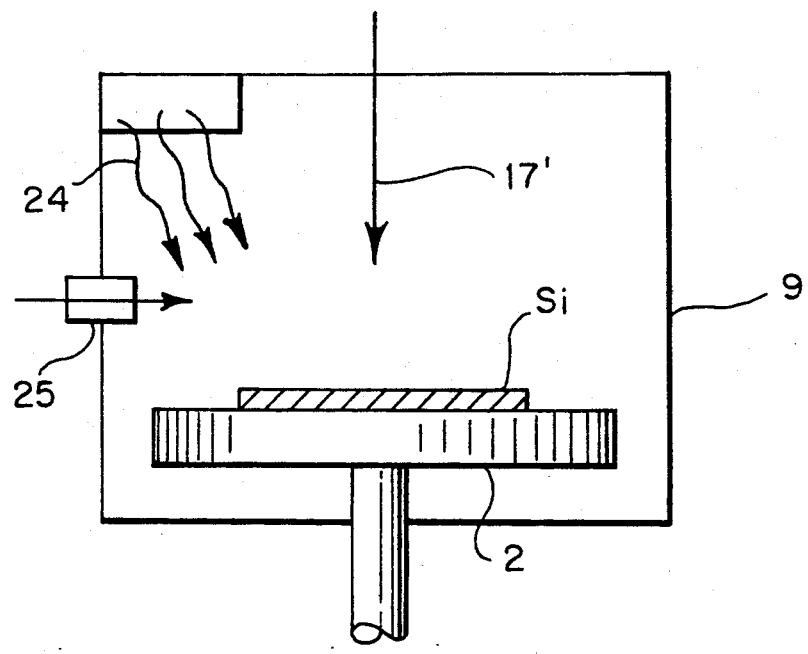

FIG. 9 shows another modification of the device of FIG. 1, wherein a second material 25 is chosen to be the same material as that of the substrate or the same material as that of the primary component of the substrate. The second material is introduced into the vacuum chamber so that etching is carried out while the second material reacts. If the substrate is $n^+$-type silicon, for example, Si-containing material 25 such as $SiH_4$, $Si_2H_6$, $Si(CH_3)_4$ as an organic compound, or the like, may be introduced and decomposed by the optical beam 24. With Si being deposited on the substrate surface in this manner, etching is effected by the heated reactive gas beam 17′ to produce the results of FIG. 2(a). Since deposited silicon does not contain an impurity with respect to a silicon substrate, anisotropic etching can be made by the heated chlorine reactive gas beam, or the like. It is possible to first convert Si to a molecular beam and then to apply the molecular beam to the substrate in order to deposit Si on the substrate.

Figure 10:
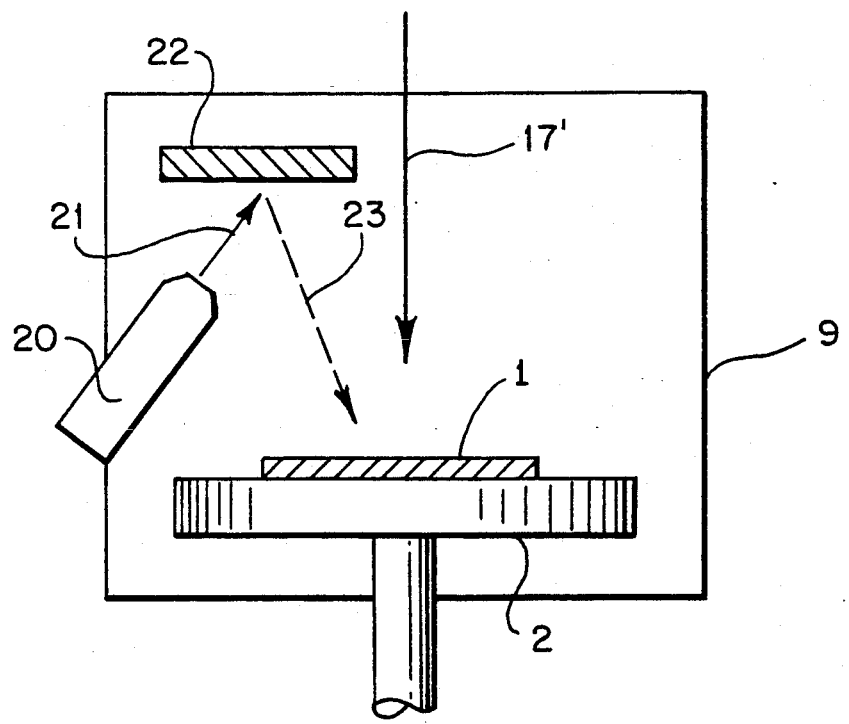

FIG. 10 shows a further modification of the device of FIG. 1 where an ion beam 21 is generated by an ion gun 20 and a sputter substrate 22 is sputtered by the ion beam 21 to deposit sputter material 23 on the substrate 1. Besides the method using the ion gun, the sputter method which applies plasma generated by a microwave or the like to the sputter substrate 22 may be employed. Anisotropic etching can be made, for example, by using $SiO_2$ or $Si_3N_4$ of the heated reactive gas beam 17′ while depositing such material 23 on the substrate 1.

Besides the material described above for all of the embodiments, carbon-type materials can be used as the second material for protecting the sidewall of the etching hole. It is possible, for example, to generate the plasma beam 5′ of $CH_4$ of the like by device shown in FIG. 1 and to etch while carbonizing the substrate. An organic material such as a polymer can be used for the sputter substrate 22 shown in FIG. 10.

The second material introduced for improving fabrication accuracy of the substrate may be a catalyst for improving reactivity of the substrate. For example, when the surface layer on the substrate 1 to be fabricated is $SiO_2$, and HF or $F_2$ is used as the reactive gas, the fabrication speed can be increased by introducing $H_2O$ or $H_2$ as the second material in the form of atmospheric gas or converting it to a gas beam and applying it onto the substrate 1. Furthermore, anisotropic etching can be made by blowing these catalysts in the beam form only to the bottom surface of the fabrication hole of the substrate 1.

In the embodiments described above, fabrication accuracy of the surface and its speed can be controlled easily by intermittently or alternately flowing the hot reactive gas 17 and the second material 5. The reaction can be controlled easily by raising or lowering the temperature of the substrate 1 in accordance with the control of the introduction of the reactive gas 17 and the second material 5.

Generally, the reactive gas is a halogen containing gas and specific examples include $NS_3$, $SF_6$, $XeF_2$ and HCl.

The substrate 1 that can be fabricated according to the present invention includes other metals and semiconductor compounds in addition to Si and $SiO_2$. Etching can be made with high fabrication accuracy by the use of GaAs or GaAsAl for the substrate 1, $Cl_2$ or HCl for the reactive gas 17 and $O_2$ or $N_2$ for the second material, for example. Etching can use a mixed gas of a fluorine type gas or a chlorine type gas, such as $SF_6$ and $SiCl_4$, as the reactive gas.

Different modifications of the basic device shown in FIG. 1 have been shown and explained. Where they are not inconsistent with each other, these modifications may be combined.

With respect to the device produced according to the above explanation, its application may be for etching of polysilicon used as an electrode in LSI, for example. With respect to LSI, damage incurred during device fabrication reduces reliability. Therefore, LSI products having high reliability can be produced according to the present invention.

With the present invention, the reactive gas 17 must be introduced in the form of a beam to provide the most improvement in fabrication accuracy. As a guideline, the distance L between the expansion port of the nozzle 3, its exit end, and the exposed surface of the substrate 1 must be smaller than the mean free path of the reactive gas molecules. If the distance L between the expansion port of the nozzle 3 and the substrate 1 is smaller, the density of the beam becomes high and the fabrication speed increases, but in-plane uniformity of the fabrication surface worsens. If L is greater, on the other hand, the fabrication speed drops but in plane uniformity is improved. The results of experiments reveal that L is suitable from 20 to 70 mm. If L is 20 mm, the necessary pressure is such that the mean free path of the reactive gas is greater than L in order to render the reactive gas in a beam at this distance. When the reactive gas is $Cl_2$, for example, the mean free path becomes about 20 mm at a pressure of about $2.3 \times 10^{-3}$ Torrs. In other words, when $Cl_2$ and the second material are introduced, the pressure inside the vacuum chamber 9 must be set below $2.3 \times 10^{-3}$ Torrs for this example.

In accordance with the present invention, fabrication is accomplished with the reaction of the surface of the substrate controlled by introduction of the second material. For this reason, fabrication accuracy can be improved. Since fabrication employs neutral particles having low energy, the substrate is hardly damaged.

The present invention specifically relates to etching and the second material is added to reduce, retard or inhibit the etching, particularly the sidewall etching. Some known etching can etch without any sidewall etching, that is produce anisotropic etching. Other etching is isotropic etching, which will have sidewall etching. The present invention is specifically related to reducing the sidewall etch rate to a greater extent than reducing the bottom wall etching rate to reduce the extent of isotropic etching. Sufficient introduction of a second material for inhibiting sidewall etching can produce anisotropic etching, that is can produce etching without any sidewall etching. At times, however, sidewall etching may be desired to some extent for different manufacturing purposes. With the present invention, the extent of the sidewall etching can be reduced partially, but not eliminated, so that the extent of undercut produced by the sidewall etching can be controlled to produce the desired undercutting. With the present invention, etching is reduced by the introduction of second material, more specifically, etching is reduced in the side walls to a greater extent than it is reduced in the bottom wall, and upon certain occasions the sidewall etching is completely eliminated or prevented to provide anisotropic etching.

While in the preferred embodiment, the hot reactive gas etching is by a beam in a direction perpendicular to the substance and the second material is most desirably introduced at an acute angle with respect to the direction of the reactive gas introduction, the present invention is also applicable to the reactive gas being introduced at an acute angle with respect to the substrate in which case the second material is most desirable still introduced at an acute angle with respect to the direction of the introduction of the active gas. That is, it is most desirable to have some acute angle between the direction of flow of the second gas and the reactive gas, so that the side walls produced by the reactive gas will be impinged upon directly by the second material for the more effective application of the second material in reducing sidewall etching.

The second material can be introduced as a gas, introduced as a plasma, or introduced in other forms, for example by sputtering or a molecular beam in the case of silicon.

A reduction in the sidewall etching can also be expressed in the following manner. The hot reactive gas flows toward the substrate along a specific path, to primarily or most desirably produce etching in such direction. As shown in FIGS. 2(a) and 2(b) the etching rate in the direction of the flowing of the hot reactive gas will be identified by A. The sidewall etching can be defined by B, with direction B being perpendicular to the direction A. In the specific embodiment of the present invention, the direction of the etching A is perpendicular to the substrate, while the direction of the etching B for the sidewall is parallel to the surface of the substrate, but the substrate may be placed at other angles. Most important is that the introduction of the second material reduces the etching B to a greater extent than it reduces the etching A, and in fact it is not necessary for introduction of the second material to reduce the etching A at all. Expressed another way, the ratio A/B is increased by the introduction of the second material. Preferably, the ratio of A/B is controlled by the introduction of the second material according to the present invention to produce a desirable effect, and the desirably effect may be the complete elimination of the etching B to provide for anisotropic etching or the reduction of the etching B to provide a desired reduced undercut, or the reduction of the etching B in one direction for one sidewall by directly impinging a beam of second material on such sidewall while at the same time reducing the etching B for an opposed sidewall not at all or to a reduced extent to provide some form of undercut for the opposed sidewall that may be desired for various purpose.

While preferred embodiments have been described with variations, further embodiments, variations and modifications are contemplated within the spirit and scope of the following claims.

What is claimed is:

1. In an electronic device manufacturing process, including a hot reactive gas etching method for a substrate of the electronic device, the etching method comprising the steps of:
   providing an etching mask on the substrate;
   maintaining at least one portion of the substrate surface exposed through the mask in a vacuum chamber for the remaining steps of the method;
   etching by directly impinging a hot reactive gas beam produced from a first material through the mask onto the exposed surface of the substrate for a time sufficient to etch the substrate surrface thereby producing an etched area having at least one side and bottom surfaces; and
   introducing a second material different from the first material used in producing the hot reactive gas beam so that the second material contacts at least a side surface of the etched hole to an extent sufficient that the ratio of bottom surface etching to side surface etching is substantially increased, to reduce the etching on the side surface.

2. The method of claim 1, wherein said step of introducing second material introduces the second material as a flow of second material along a path having a central axis at a substantially acute angle with respect to a central axis of the path of the hot reactive gas beam so that the path of the second material directly impinges upon the side surface through the mask.

3. The method of claim 1, wherein said introducing of second material provides the second material as plasma.

4. The method of claim 1, further including rotating the substrate relative to the vacuum chamber.

5. The method of claim 1, including heating the reactive gas within the vacuum chamber.

6. The method of claim 2, wherein the substrate is composed of n-type silicon; and
   wherein the second material reacts with the substrate and thereby produces one of an oxide and a nitride on the side surfaces.

7. The method of claim 6, wherein the hot reactive gas beam is a neutral particle beam with an energy below 1 eV and said step of introducing is sufficient to provide anisotropic etching.

8. The method of claim 1, including heating the second material within the vacuum chamber with an electric heater surrounding a nozzle for the second material.

9. The method of claim 1, further including heating the second material within the vacuum chamber by irradiating the second material.

10. The method of claim 1, including heating the reactive gas within the vacuum chamber by passing the reactive gas through a nozzle surrounded by a heater.

11. The method of claim 1, including heating the reactive gas within the vacuum chamber by contacting the reactive gas with a heated plate and thereafter passing the hot reactive gas through a collimator to produce a plurality of hot reactive gas beams.

12. The method of claim 1, including heating the reactive gas within the vacuum chamber by passing the reactive gas through a gas reservoir surrounded by a heater and thereafter passing the hot reactive gas through a collimator to produce the hot reactive gas beams.

13. The method of claim 1, wherein the hot reactive gas beam is a neutral particle beam with an energy below 1 eV.

14. The method of claim 1, wherein the substrate is composed of n-type silicon.

15. The method of claim 2, wherein said step of introducing is sufficient to provide anisotropic etching.

16. The method of claim 2, wherein the acute angle is at least 45 degrees.

17. The method of claim 1, wherein the second material reacts with the substrate and thereby produces one of an oxide and a nitride on the side surfaces.

18. The method of claim 1, wherein the hot reactive gas is intermittently supplied.

19. The method of claim 1, further including controlling at least one of the temperature and flow of the hot reactive gas, the flow of the second material and the length of the hot reactive gas beam within the vacuum chamber.

20. The method of claim 1, wherein said step of introducing is sufficient to provide anisotropic etching.

21. The method of claim 3, further including removing charged particles from the plasma beam of second material.

22. The method of claim 2, wherein the substrate is provided of $N^+$-type silicon.

23. The method of claim 1, wherein the hot reactive gas includes a halogen.

24. The method of claim 1, including maintaining the length of the hot reactive gas beam smaller than the mean free path of the reactive gas molecules.

25. The method of claim 2, wherein the hot reactive gas beam is a neutral particle beam with an energy below 1 eV.

26. The method of claim 25, wherein the hot reactive gas includes a halogen; and
   including maintaining the length of the hot reactive gas beam smaller than the mean free path of the reactive gas molecules.

27. The method of claim 26, wherein substrate is composed of n-type silicon; and
   wherein the second material reacts with the substrate and thereby produces one of an oxide and a nitride on the side surfaces.

28. The method of claim 27, wherein said step of introducing is sufficient to provide anisotropic etching.

29. A surface fabricating device for teating the exposed surface of a substrate, including:
   a vacuum chamber;
   means for providing a hot reactive gas beam inside of said vacuum chamber;
   means for impinging the hot reactive gas beam directly on the exposed surface of the substrate sufficiently to react with the substrate and accomplish the treating; and
   means for reducing the reaction rate on selected portions of the exposed surface to a greater extent than the remaining portions by introducing a second material onto the surface of said substrate.

30. A device of claim 29, wherein said reaction is etching and said means for reducing a second material introduces the second material of a type sufficient to react with the surface of the substrate to produce one of an oxide and a nitride to inhibit etching by the hot reactive gas beams.

31. A device of claim 29, wherein said means for reducing introduces the second material after changing the second material into plasma within the vacuum chamber.

32. A device of claim 31, further comprising means for removing charged particles from the plasma of the second material.

33. A device of claim 31, wherein said means for reducing introduces the second material as a heated gas.

34. A device of claim 29, wherein said means for reducing sputters solid material containing the second material and introduces the sputtered material as the second material in the vacuum chamber.

35. A device of claim 29, wherein said means for reducing decomposes a material containing the second material to produce a decomposition product as the second material.

36. A device of claim 29, wherein said means for reducing introduces the second material with oxygen as its active ingredient.

37. A device of claim 29, wherein said means for reducing introduces the second material with nitrogen as its active ingredient.

38. A device of claim 29, wherein said means for reducing introduces the second material with carbon as its active ingredient.

39. A device of claim 29, wherein said means for reducing introduces the second material with the principle component of the substrate as its active ingredient.

40. A device of claim 29, wherein said means for reducing introduces the second material with catalyst to chemically react with the surface of the substrate as its active ingredient.

41. A device of claim 29, wherein said means for providing generates the reactive gas to intermittently produce the hot reactive gas beam for control of etching.

42. A device of claim 29, wherein said means for reducing introduces the second material intermittently for control etching.

43. A devcie of claim 29, including means for controlling the vacuum within the vacuum chamber so that the means free path of the gas molecules within the hot reactive gas beam is at least 20 mm.

44. A device of claim 29, wherein said means for reducing introduces the second material as a flow of second material along a path having a central axis at a substantially acute angle with respect to the central axis of the path of the hot reactive gas beam and so that the path of the second material directly impinges upon the side surfaces through the mask.

45. A device of claim 44, wherein said angle is about 45°.

46. A device of claim 29, wherein said means for providing provides the hot reactive gas beam as a neutral particle beam with an energy below 1 eV.

47. A method for treating the exposed surface of a substrate, including:
providing a hot reactive gas beam inside of a vacuum chamber;
impinging the hot reactive gas beam directly on the exposed surface of the substrate sufficiently to react with the substrate and accomplish the treating; and
reducing the reaction rate on selected portions of the exposed surface to a greater extent than the remaining portions by introducing a second material onto the surface of the substrate.

48. A method of claim 47, wherein the hot reactive gas beam is a neutral particle beam with an energy below 1 eV.

49. A method of claim 47, including maintaining the length of the hot reactive gas beam smaller than the means free path of the reactive gas molecules.

50. A method of claim 47, wherein said step of reducing introduces the second material as a flow of second material along a path having a central axis at a substantially acute angle with respect to the central axis of the path of the hot reactive gas beam so that the path of the second material directly impinges upon the side surfaces through the mask.

51. A method according to claim 49, wherein the hot reactive gas beam is a neutral particle beam with an energy below 1 eV.

* * * * *